US011640930B2

(12) United States Patent
Hsu et al.

(10) Patent No.: US 11,640,930 B2
(45) Date of Patent: May 2, 2023

(54) SEMICONDUCTOR PACKAGE HAVING LIQUID-COOLING LID

(71) Applicant: MEDIATEK INC., Hsin-Chu (TW)

(72) Inventors: Chia-Hao Hsu, Hsinchu (TW); Tai-Yu Chen, Hsinchu (TW); Sheng-Liang Kuo, Hsinchu (TW); Bo-Jiun Yang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 270 days.

(21) Appl. No.: 16/989,919

(22) Filed: Aug. 11, 2020

(65) Prior Publication Data
US 2021/0074608 A1 Mar. 11, 2021

Related U.S. Application Data

(60) Provisional application No. 62/991,618, filed on Mar. 19, 2020, provisional application No. 62/896,028, filed on Sep. 5, 2019.

(51) Int. Cl.
*H01L 23/473* (2006.01)
*H01L 23/16* (2006.01)
*H01L 23/00* (2006.01)

(52) U.S. Cl.
CPC .......... *H01L 23/473* (2013.01); *H01L 23/16* (2013.01); *H01L 23/562* (2013.01); *H01L 24/16* (2013.01); *H01L 2224/16227* (2013.01); *H01L 2924/3511* (2013.01)

(58) Field of Classification Search
None
See application file for complete search history.

(56) References Cited

U.S. PATENT DOCUMENTS

| 5,285,351 | A | 2/1994 | Ikeda |
| 6,140,141 | A | 10/2000 | Davidson |
| 2003/0110788 | A1 | 6/2003 | Koeneman |
| 2006/0291164 | A1* | 12/2006 | Myers .................. H01L 23/473 257/E23.098 |
| 2008/0230894 | A1 | 9/2008 | Heydari |
| 2008/0242002 | A1 | 10/2008 | Colgan |
| 2009/0316360 | A1 | 12/2009 | Campbell |
| 2013/0148305 | A1 | 6/2013 | Ankireddi |

FOREIGN PATENT DOCUMENTS

| EP | 1 739 746 A2 | 1/2007 |
| EP | 1 739 746 A3 | 12/2008 |
| JP | 4-122054 A | 4/1992 |
| TW | 201800893 A | 1/2018 |
| WO | 2019/066901 A1 | 4/2019 |

* cited by examiner

Primary Examiner — Bo B Jang
(74) Attorney, Agent, or Firm — Winston Hsu

(57) ABSTRACT

A semiconductor package includes a substrate; a die mounted on a top surface of the substrate in a flip-chip fashion; and a lid mounted on the die and on a perimeter of the substrate. The lid includes a cover plate and four walls formed integral with the cover plate. A liquid-cooling channel is situated between the cover plate of the lid and a rear surface of the die for circulating a coolant relative to the semiconductor package.

14 Claims, 12 Drawing Sheets

SEMICONDUCTOR PACKAGE HAVING LIQUID-COOLING LID

CROSS REFERENCE TO RELATED APPLICATIONS

This application claims priority from U.S. provisional application No. 62/896,028 filed on Sep. 5, 2019 and priority from U.S. provisional application No. 62/991,618 filed on Mar. 19, 2020, the disclosure of which are included in their entirety herein by reference.

BACKGROUND

The present disclosure relates generally to the field of semiconductor packaging. More particularly, the present disclosure relates to a lidded semiconductor package having a liquid-cooling lid mounted to back-side of a die without the need of applying a thermal interface material at an interface between the lid and die.

Managing heat generated by the operating semiconductor chip has become an important technical issue. As temperature increases chip failure rates increase and heat may cause permanent damage to the semiconductor chip. Consequently, effective dissipation of heat becomes a crucial problem for semiconductor packages.

Conventionally, a heat sink is attached to a surface of the semiconductor package to improve the heat dissipation. For example, in the case of a semiconductor package having a resin molding compound encapsulating the semiconductor chip, the heat sink is directly attached to a surface of the molding compound. Heat is transferred via the molding compound to the heat sink and the heat sink dissipates the heat via convection. However, the molding compound has a relatively low thermal conductivity and the efficiency of heat dissipation through the heat sink attached to the surface of the molding compound is relatively low.

As power levels and heat generation increase in high-performance CPUs and other semiconductor devices, the thermal performance of commonly used packaging components is becoming a limiting factor. Many such devices are mounted in flip chip packages, in which the die is underfilled on the active side and in direct contact with a thermal interface material (also known as "TIM" or "TIM 1"), with a metal or ceramic lid attached on the opposite side. The lid serves as physical protection for the die as well as package stiffener, while the thermal interface material helps to dissipate excess heat. In some cases, a heat sink may be mounted on the lid with another TIM layer (also known as "TIM 2"). However, the thermal performance and heat-dissipating efficiency of the above-described configurations are still not satisfactory.

With power levels steadily rising in new and emerging device designs, there is a constant need in this industry to provide improved thermal properties of semiconductor packages to ensure performance and reliability.

SUMMARY

It is an object of the invention to provide an improved semiconductor package with a liquid-cooling lid in order to solve the above-mentioned prior art problems or shortcomings.

It is another object of the invention to provide an improved semiconductor package with improved thermal performance without compromising the ability of warpage control and surface mount technique (SMT) control.

One aspect of the invention provides a semiconductor package including a substrate, a die mounted on a top surface of the substrate in a flip-chip fashion, and a lid mounted on the die and on a perimeter of the substrate. The lid includes a cover plate and four walls formed integral with the cover plate. A liquid-cooling channel is situated between the cover plate of the lid and a rear surface of the die for circulating a coolant relative to the semiconductor package.

According to some embodiments, the cover plate is directly secured to the rear surface of the die with an adhesive layer.

According to some embodiments, the lid comprises a trenched feature recessed into a lower surface of the cover plate.

According to some embodiments, the trenched feature comprises a half-etched trench.

According to some embodiments, the liquid-cooling channel is constructed by combining the trenched feature and the rear surface of the die.

According to some embodiments, the coolant in the liquid-cooling channel is in direct contact with the rear surface of the die during operation.

According to some embodiments, the liquid-cooling channel is buried within the cover plate of the lid.

According to some embodiments, the coolant in the liquid-cooling channel is not in direct contact with the rear surface of the die during operation.

According to some embodiments, a liquid inlet and a liquid outlet are provided in the lid, which communicate with the liquid-cooling channel.

According to some embodiments, the liquid inlet and the liquid outlet are disposed in an upper surface of the cover plate.

According to some embodiments, the liquid inlet and the liquid outlet are disposed in at least one of the four walls.

According to some embodiments, the liquid inlet and the liquid outlet are through holes with threaded inner surface.

According to some embodiments, the die is underfilled with an encapsulant material.

According to some embodiments, a plurality of solder balls is disposed on a bottom surface of the substrate.

According to some embodiments, the substrate comprises a packaging substrate.

According to some embodiments, the lid comprises aluminum, copper or an alloy thereof.

Another aspect of the invention provides a semiconductor package including a substrate; a die mounted on a top surface of the substrate in a flip-chip fashion, a dummy layer mounted on a rear surface of the die, and a lid mounted on the dummy layer and on a perimeter of the substrate. The lid includes a cover plate and four walls formed integral with the cover plate. A liquid-cooling channel is situated between the cover plate of the lid and the dummy layer for circulating a coolant relative to the semiconductor package.

According to some embodiments, the dummy layer comprises a dummy die or a metal layer.

According to some embodiments, the dummy layer has an upper surface that is adhered to a lower surface of the cover plate of the lid with a first adhesive layer According to some embodiments, the dummy layer has a lower surface that is adhered to the rear surface of the die with a second adhesive layer.

According to some embodiments, the dummy layer comprises a trenched feature recessed into the upper surface of the dummy layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

Figure 1:
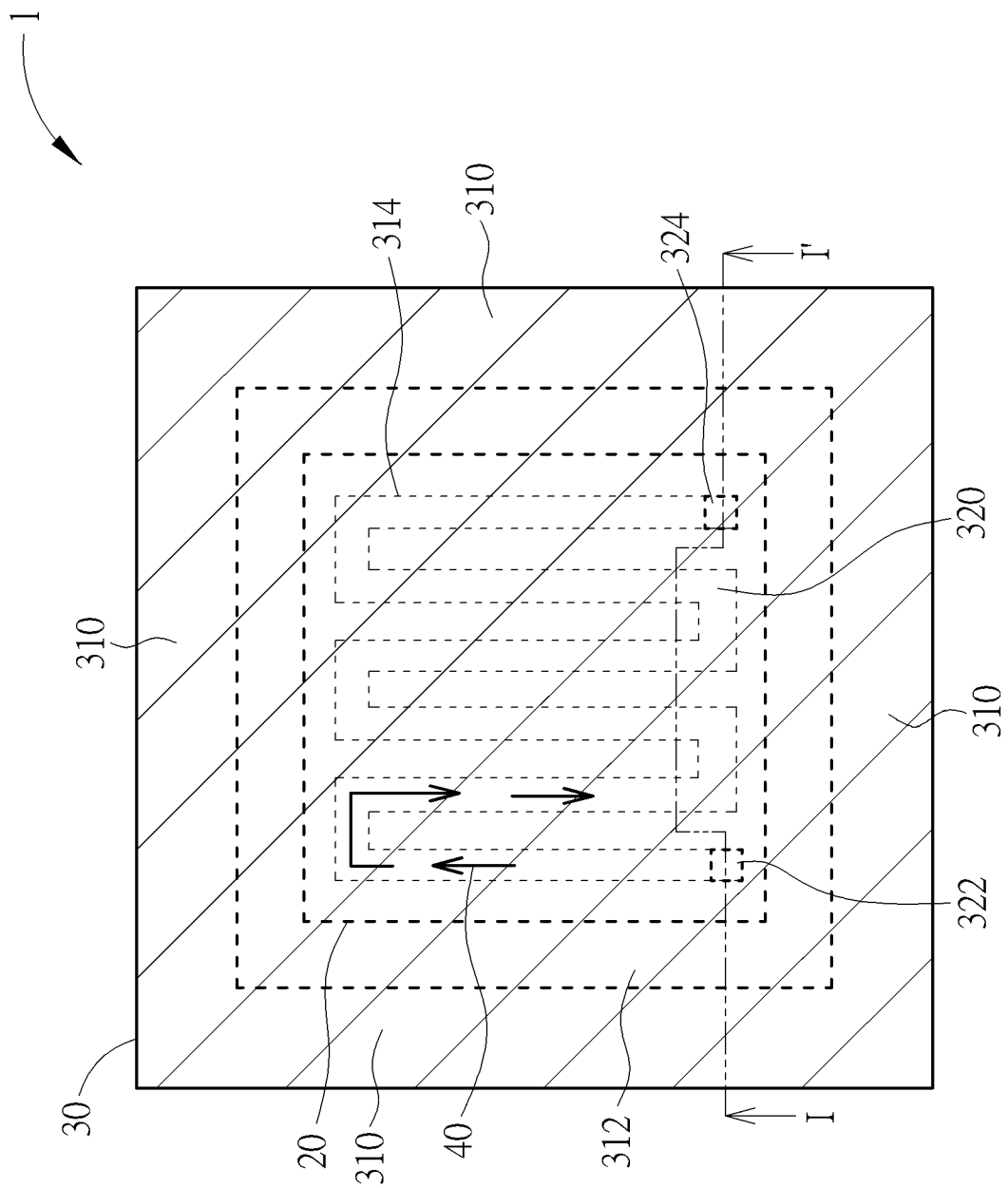
FIG. 1 is a perspective top view of a lidded semiconductor package in accordance with one embodiment of the invention.

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Packaging of an integrated circuit (IC) chip can involve attaching the IC chip to a substrate (a packaging substrate) which, among other things, provides mechanical support and electrical connections between the chip and other electronic components of a device. Substrate types include, for example, cored substrates, including thin core, thick core (laminate BT (bismaleimide-triazine resin) or FR-4 type fibrous board material), and laminate core, as well as coreless substrates. Cored package substrates, for example, can be built up layer by layer around a central core, with layers of conductive material (usually copper) separated by layers of insulating dielectric, with interlayer connections being formed with through holes or microvias (vias).

Thermal design and material selection continues to be a concern for electronic packages, particularly for flip chip ball grid array packages (FCBGA). Larger die sizes exhibit greater package warpage due to the difference in thermal expansion coefficients between silicon and laminate materials. As a result, large die packages are more difficult to solder mount and may produce larger variations in the bond line thickness between the die and external heat sinks.

The present disclosure pertains to a flip chip lidded ball grid array (FCLBGA) package with a lid, such as a copper lid, mounted to the die back-side without the need of using a thermal interface material (also known as "TIM 1") between the lid and die. The lid is integrated with at least one liquid-cooling path or liquid-cooling channel. Therefore, a conventional heat sink, which is usually mounted on the lid, may be spared.

Figure 2:
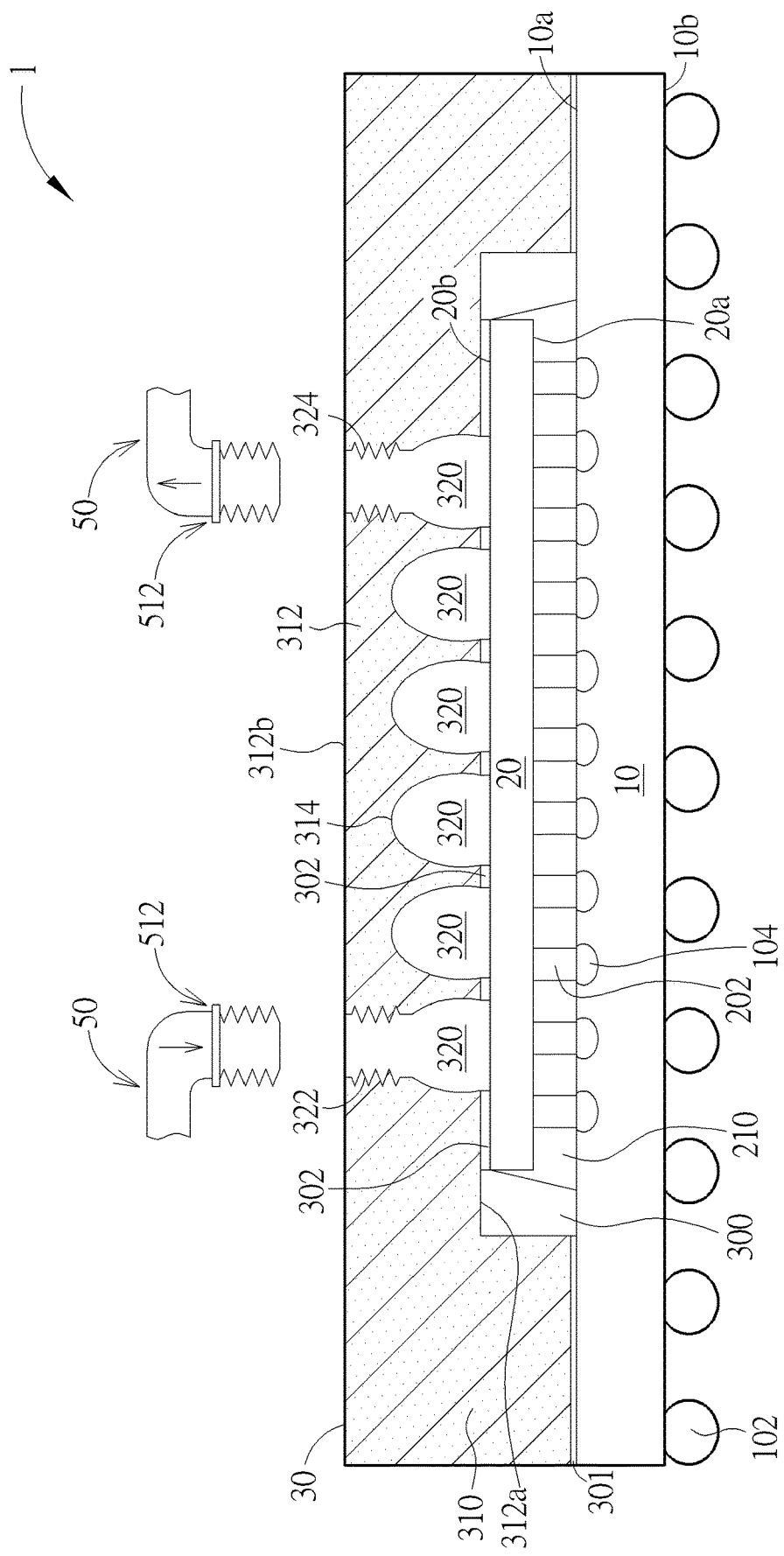
FIG. 2 is a cross-sectional view taken along line I-I' of FIG. 1.

Please refer to FIG. 1 and FIG. 2. FIG. 1 is a perspective top view of a lidded semiconductor package in accordance with one embodiment of the invention. FIG. 2 is a cross-sectional view taken along line I-I' of FIG. 1. As shown in FIG. 1 and FIG. 2, the semiconductor package 1 comprises a substrate 10 such as a packaging substrate or the like. The substrate 10 comprises a top surface (or chip-mounting surface) 10a and a bottom surface 10b. For the sake of simplicity, the traces and interconnection in the substrate 10 are not shown in the figures. It is understood that the substrate 10 comprises traces and interconnection elements that provide electrical connections between a chip and an external electronic component such as a system board.

According to one embodiment, a plurality of solder balls 102 is disposed on the bottom surface 10b of the substrate 10. According to one embodiment, a semiconductor chip or die 20 may be mounted on the top surface 10a of the substrate 10 in a flip-chip fashion. The die 20 has an active surface 20a that faces downwardly to the substrate 10. A plurality of connecting elements 202 such as conductive bumps, micro bumps, pillars or the like may be provided on the active surface 20a. The connecting elements 202 are bonded to respective pads 104 disposed on the top surface 10a of the substrate 10. The die 20 may be underfilled with an encapsulant material 210 known in the art. For example, an underfill resin with a coefficient of thermal expansion (CTE) close to that of the connecting elements 202 may be deposited and cured in a gap between the die 20 and substrate 10. The use of underfill resin enables structural coupling of the chip and substrate, effectively decreasing the shear stress and thus lowering the applied strain on the solder joints.

According to one embodiment, a lid 30 is secured onto a perimeter of the top surface 10a of the substrate 10 with an adhesive layer 301. According to one embodiment, the lid 30 may comprise aluminum, copper or an alloy thereof, but is not limited thereto. A hermetic cavity 300 is created between the lid 30 and the substrate 10. The die 20 is disposed within the cavity 300 and housed by the lid 30. The lid 30 serves as physical protection for the die 20 as well as package stiffener to alleviate package warpage. According to one embodiment, the lid 30 comprises four walls 310 and a cover plate 312 formed integrally with the four walls 310. The four walls 310 are spaced apart from the die 20, while the cover plate 312 is directly secured to a rear surface 20b of the die 20 with an adhesive layer 302. It is understood that in some cases the cover plate 312 may be directly secured to the rear surface 20b of the die 20 with other means, for example, a solder tin coating.

According to one embodiment, as can be seen in FIG. 1, the lid 30 comprises a trenched feature 314 such as a serpentine half-etched trench recessed into a lower surface 312a of the cover plate 312. When the lid 30 is adhered onto the die 20 and the substrate 10, a liquid-cooling path or channel 320 for circulating a coolant 40 (shown in FIG. 1) relative to the semiconductor package 1 is formed between the cover plate 312 of the lid 30 and the rear surface 20b of the die 20. According to one embodiment, the liquid-cooling path or channel 320 is located only directly above the die 20 and does not extend beyond the die 20 when viewed from the above, as shown in FIG. 1.

According to one embodiment, the coolant 40 in the liquid-cooling path or channel 320 is in direct contact with the rear surface 20b of the die 20 during operation. Therefore, the heat generated from the die 20 can be efficiently dissipated by circulating the coolant 40 through the liquid-cooling path or channel 320 within the lid 30. Since a heat sink is spared, a very low profile semiconductor package can be provided. The improved semiconductor package is able to improve thermal performance without compromising the ability of warpage control and surface mount technique (SMT) control.

According to one embodiment, a liquid inlet 322 and a liquid outlet 324 may be provided in an upper surface 312b of the cover plate 312 of the lid 30. The liquid inlet 322 and the liquid outlet 324 communicate with the liquid-cooling path or channel 320, and may be situated at distal ends of the liquid-cooling path or channel 320, respectively. According to one embodiment, as can be seen in FIG. 2, the liquid inlet 322 and the liquid outlet 324 are through holes with threaded inner surface. A conduit or pipe 50 with an end joint or an adaptor 512 may be provided to connect with either the liquid inlet 322 or the liquid outlet 324 for flowing coolant in or out of the upper surface 312b of the cover plate 312. According to one embodiment, the adaptor 512 may have a threaded outer surface configured for coupling the pipe 50 into the liquid inlet 322 or the liquid outlet 324 having a threaded inner surface. It is to be understood that the conduit or pipe 50 may be further connected to a pump (not shown).

Figure 3:
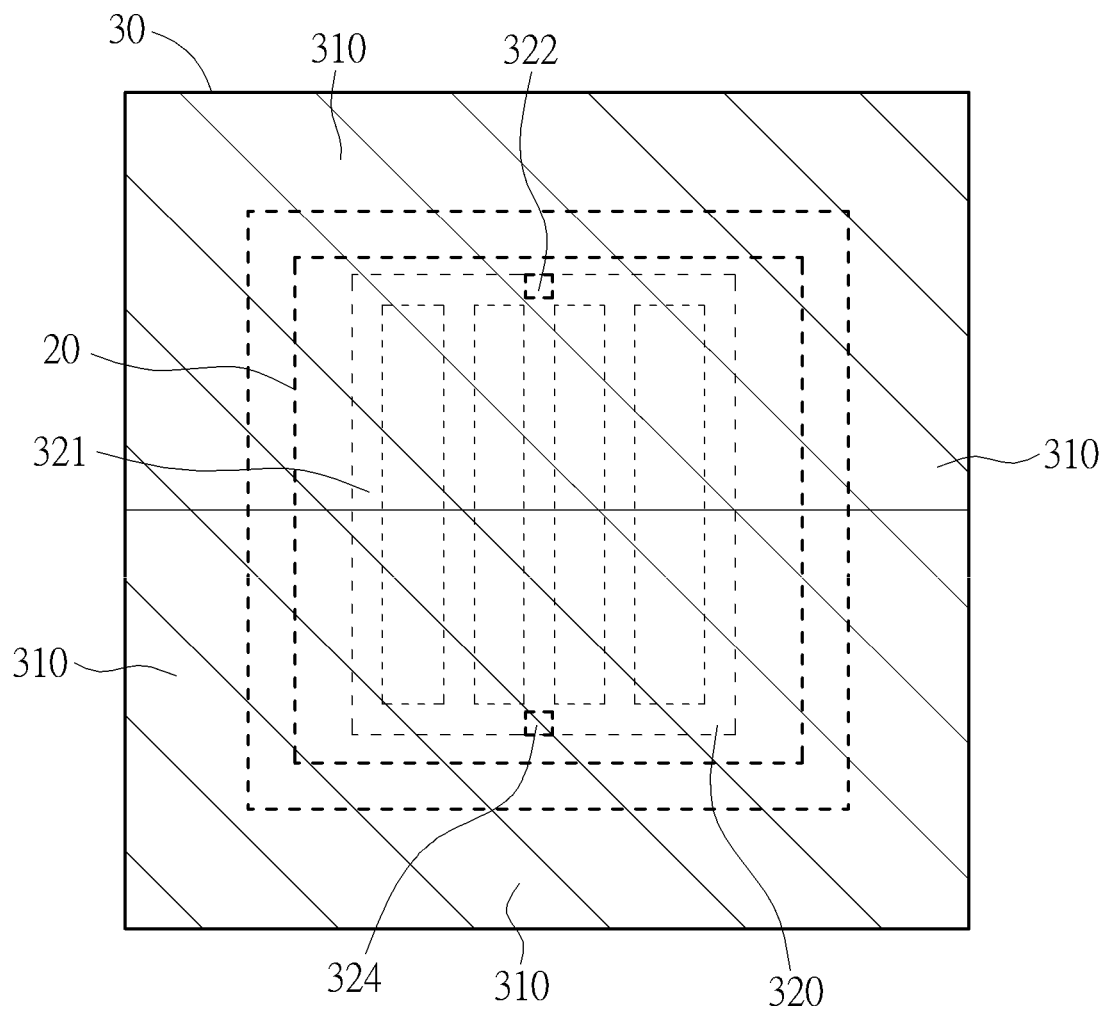
FIG. 3 and FIG. 4 illustrate some exemplary patterns for the trenched feature in the lid according to various embodiments of the invention.
Figure 4:
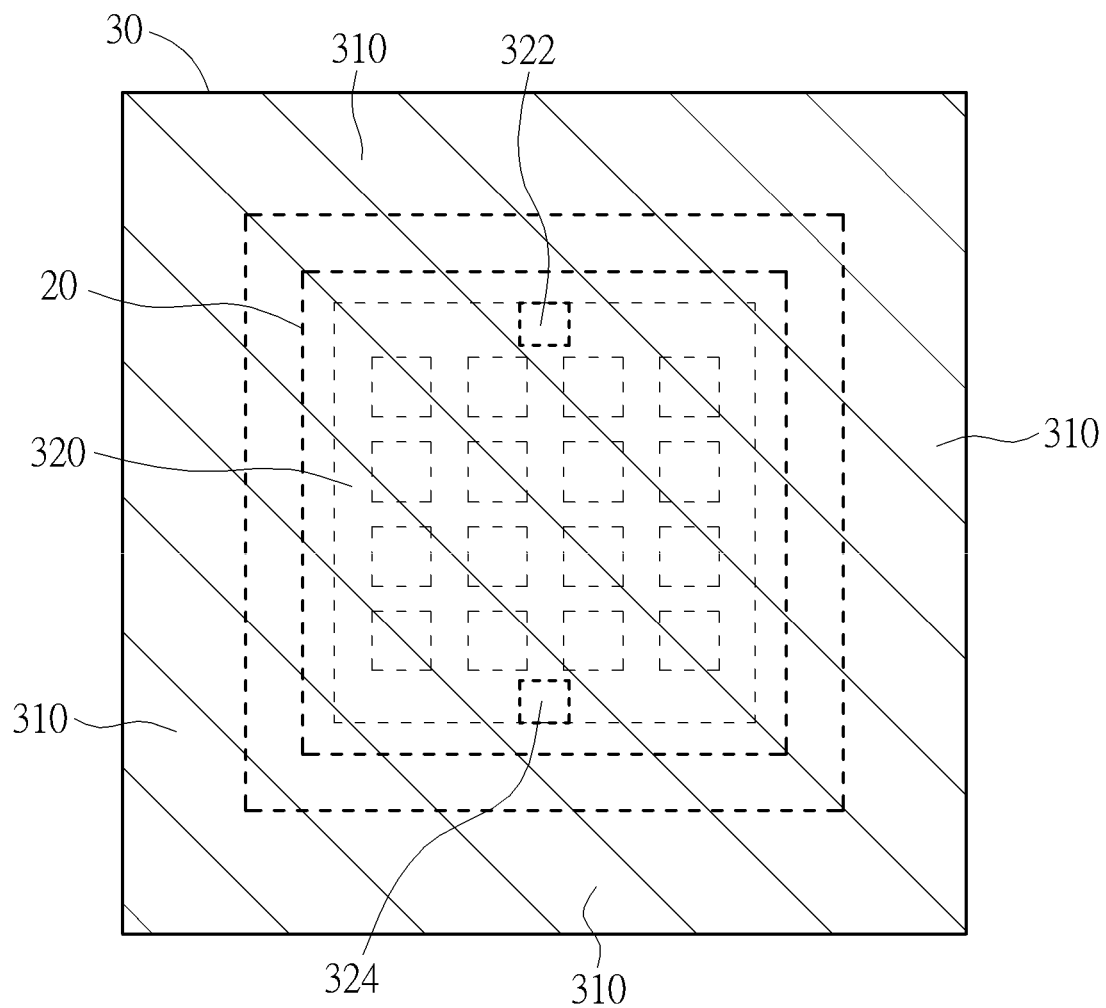

Some exemplary patterns for the liquid-cooling path or channel 320 are shown in FIG. 3 and FIG. 4. For example, in FIG. 3, the liquid-cooling path or channel 320 may be composed of a plurality of manifolds 321. For example, in FIG. 4, the liquid-cooling path or channel 320 may have a mesh-like pattern.

Figure 5:
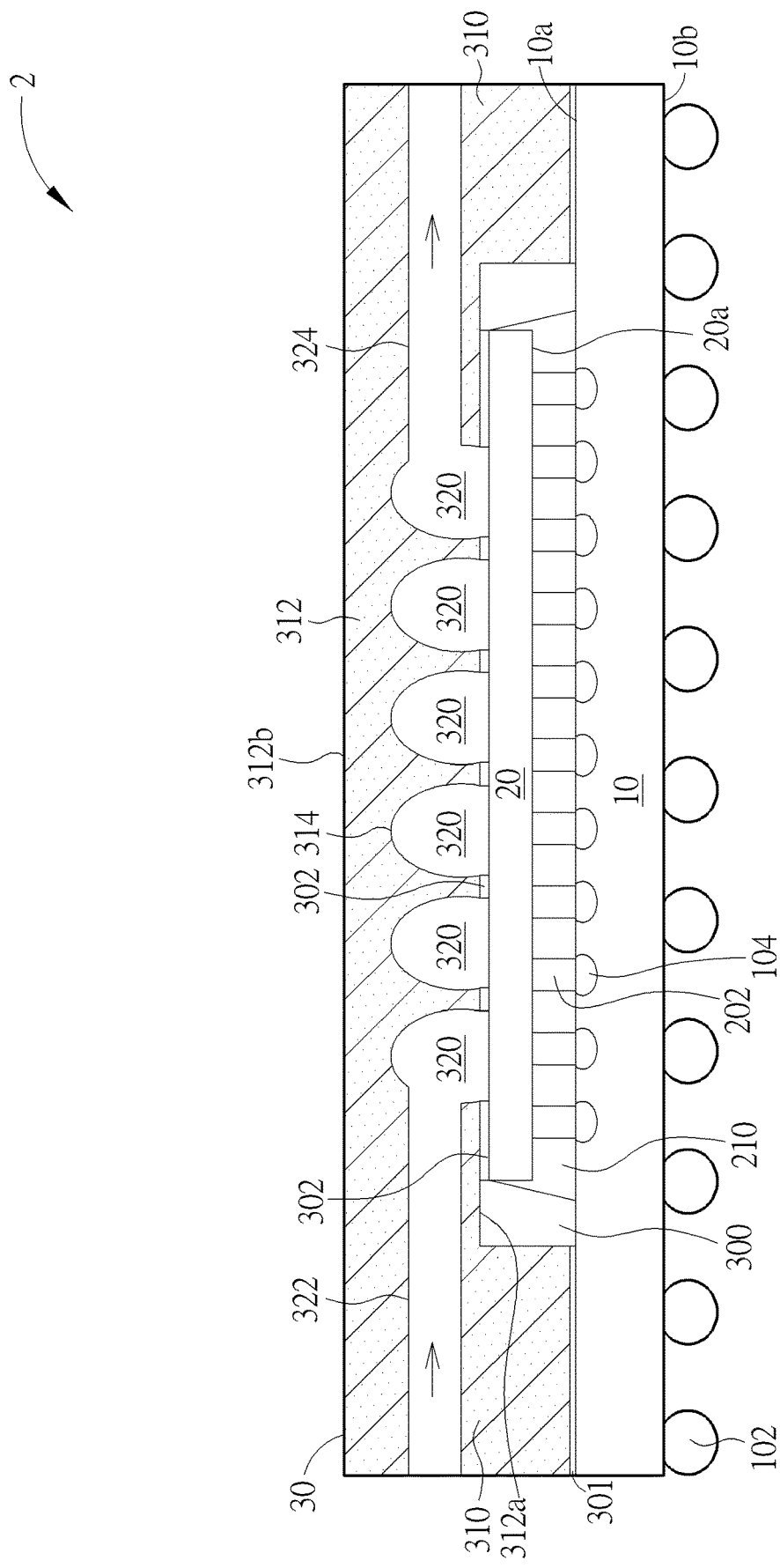
FIG. 5 is a schematic, cross-sectional diagram showing a lidded semiconductor package in accordance with another embodiment of the invention.

FIG. 5 is a schematic, cross-sectional diagram showing a lidded semiconductor package in accordance with another embodiment of the invention. As shown in FIG. 5, the differences between the semiconductor package 2 in FIG. 5 and the semiconductor package 1 in FIG. 2 include that the liquid inlet 322 and the liquid outlet 324 of the semiconductor package 2 in FIG. 5 are formed through the walls 310 and the cover plate 314 to provide a thinner semiconductor package. It is to be understood that the arrangement of the liquid inlet 322 and the liquid outlet 324 in FIG. 5 is for illustration purposes only. It is to be understood that the liquid inlet 322 and the liquid outlet 324 may be provided on the same wall 310 or on different walls 310 of the lid 30.

Figure 6:
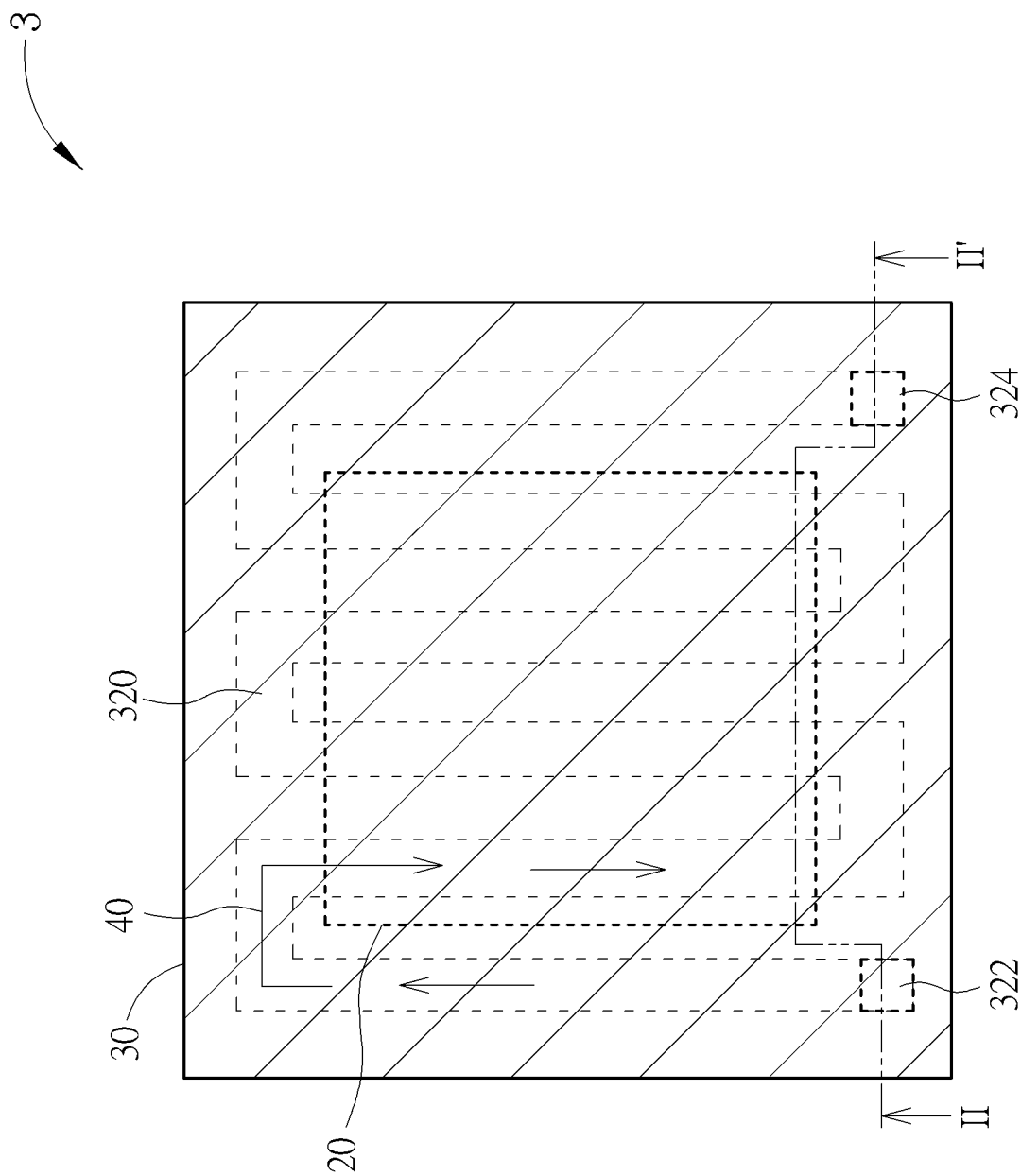
FIG. 6 is a perspective top view of a lidded semiconductor package in accordance with another embodiment of the invention.
Figure 7:
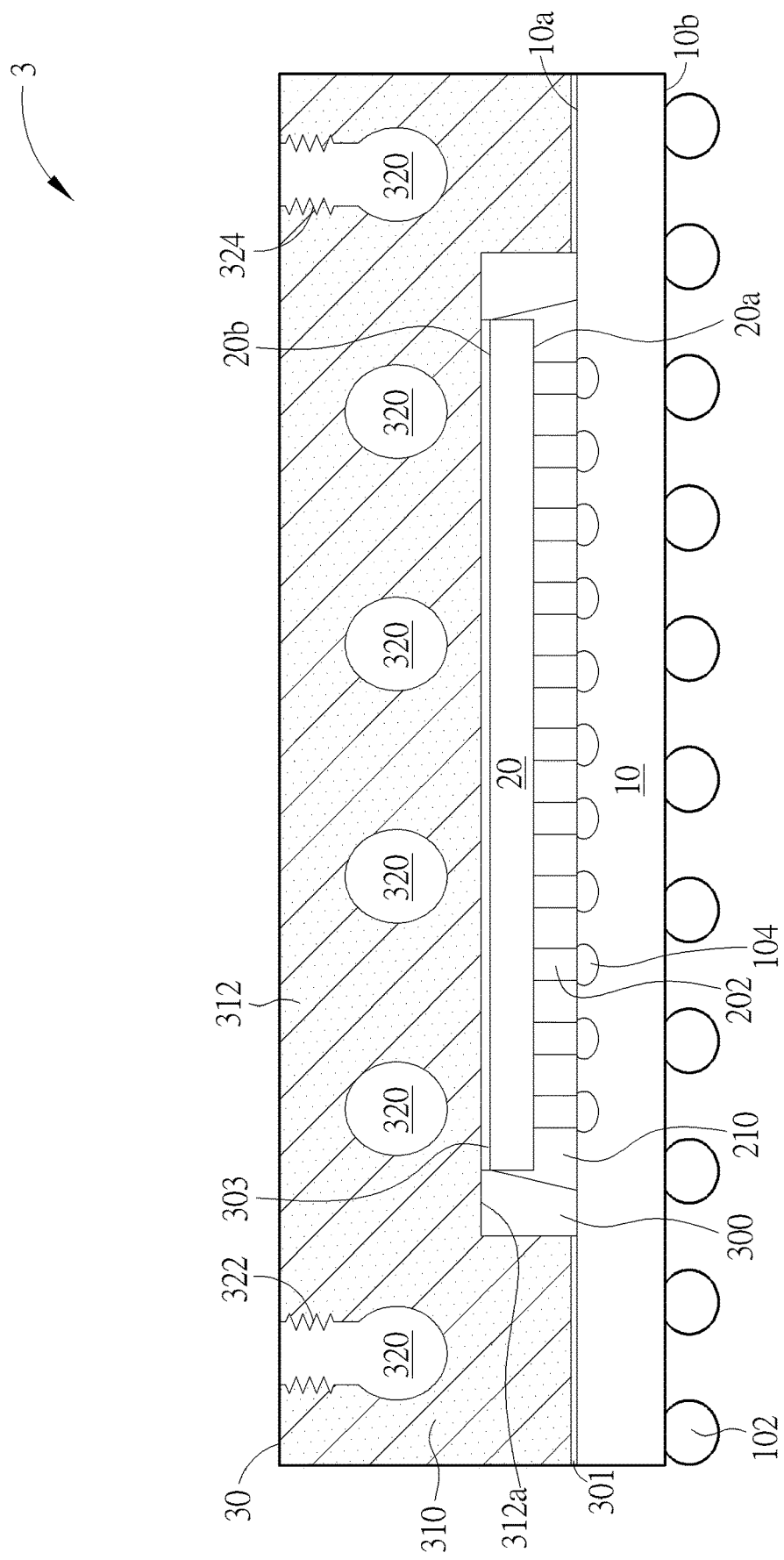
FIG. 7 is a cross-sectional view taken along line II-II' of FIG. 6.

Please refer to FIG. 6 and FIG. 7. FIG. 6 is a perspective top view of a lidded semiconductor package in accordance with another embodiment of the invention. FIG. 7 is a cross-sectional view taken along line II-II' of FIG. 6. Like layers, elements, or regions are designated by like numeral numbers or labels. As shown in FIG. 6 and FIG. 7, likewise, the semiconductor package 3 comprises a substrate 10 such as a packaging substrate or the like. The substrate 10 comprises a top surface 10a and a bottom surface 10b. According to one embodiment, a plurality of solder balls 102 may be disposed on the bottom surface 10b of the substrate 10. According to one embodiment, a die 20 may be mounted on the top surface 10a of the substrate 10 in a flip-chip fashion. The die 20 has an active surface 20a that faces downwardly to the substrate 10. A plurality of connecting elements 202 such as conductive bumps, micro bumps, pillars or the like may be provided on the active surface 20a. The connecting elements 202 are bonded to respective pads 104 disposed on the top surface 10a of the substrate 10. The die 20 may be underfilled with an encapsulant material 210 known in the art. For example, an underfill resin with a CTE close to that of the connecting elements 202 may be deposited and cured in a gap between the die 20 and substrate 10.

According to one embodiment, a lid 30 is secured onto a perimeter of the top surface 10a of the substrate 10 with an adhesive layer 301. According to one embodiment, the lid 30 may comprise aluminum, copper or an alloy thereof, but is not limited thereto. A cavity 300 is created between the lid 30 and the substrate 10 and the die 20 is disposed within the cavity 300. According to one embodiment, the lid 30 comprises four walls 310 and a cover plate 312 formed integrally with the four walls 310. The four walls 310 are spaced apart from the die 20, while the cover plate 312 is directly secured to a rear surface 20b of the die 20 with a thermal interface material (TIM) layer 303. For example, the TIM layer 303 may comprise low-modulus, Ag-filled or Al-filled gel or grease type TIM, but is not limited thereto.

According to one embodiment, as can be seen in FIG. 6, the lid 30 may comprise a liquid-cooling path or channel 320 for circulating a coolant 40 relative to the semiconductor package 3. According to one embodiment, sine the liquid-cooling path or channel 320 is buried in the lid 30, some portion of the liquid-cooling path or channel 320 may be located outside the projected area of the die 20 when viewed from the above. According to one embodiment, the coolant 40 in the liquid-cooling path or channel 320 is not in direct contact with the rear surface 20b of the die 20 during operation.

According to one embodiment, a liquid inlet 322 and a liquid outlet 324 may be provided in an upper surface 312b of the cover plate 312 of the lid 30. According to one embodiment, as can be seen in FIG. 7, the liquid inlet 322 and the liquid outlet 324 may be through holes with threaded inner surface. A conduit or pipe 50 with an end joint or an adaptor 512 may be provided to connect with either the liquid inlet 322 or the liquid outlet 324 for flowing coolant in or out of the upper surface 312b of the cover plate 312. According to one embodiment, the adaptor 512 may have a threaded outer surface configured for coupling the pipe 50 into the liquid inlet 322 or the liquid outlet 324 having a threaded inner surface.

Figure 8:
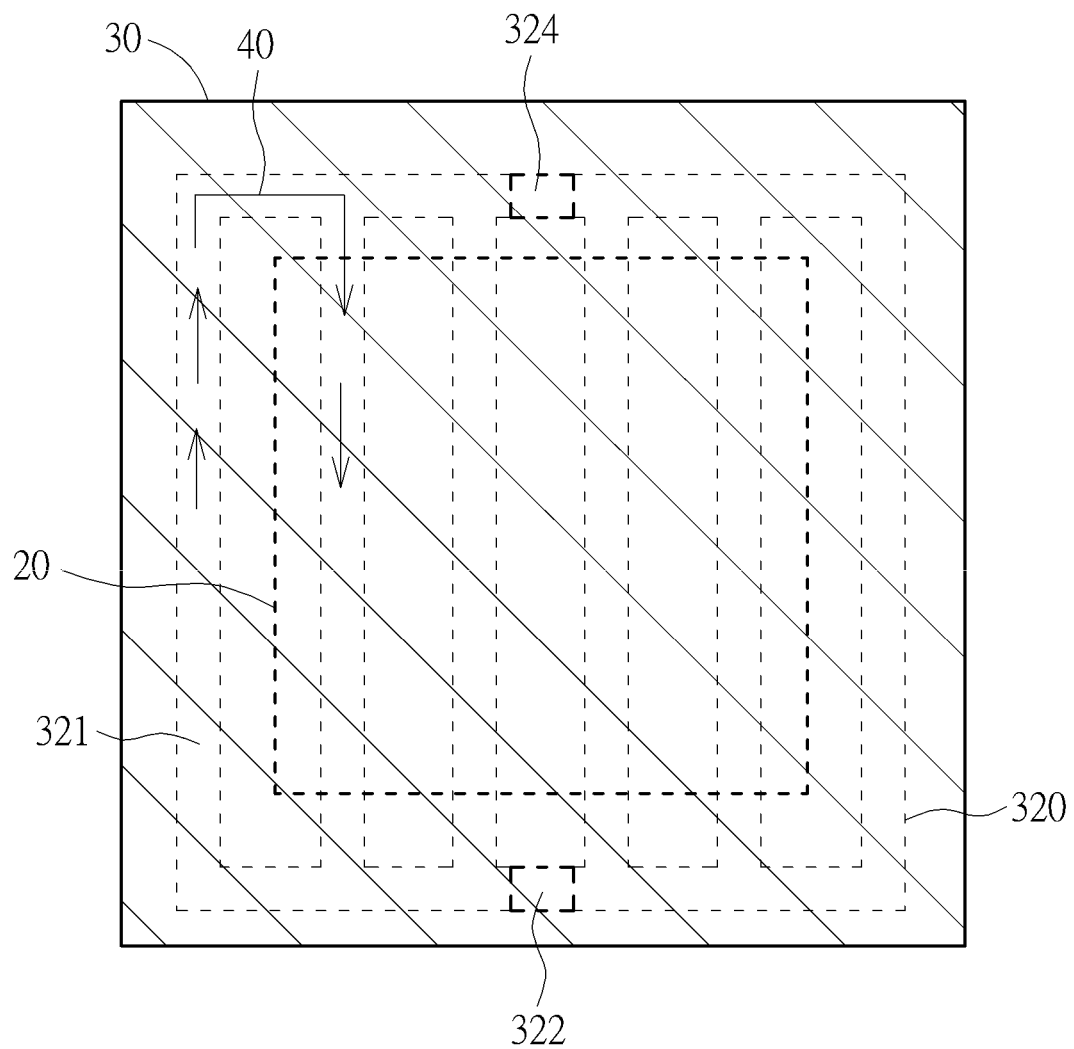
FIG. 8 and FIG. 9 illustrate some exemplary patterns for the trenched feature in the lid according to various embodiments of the invention.
Figure 9:
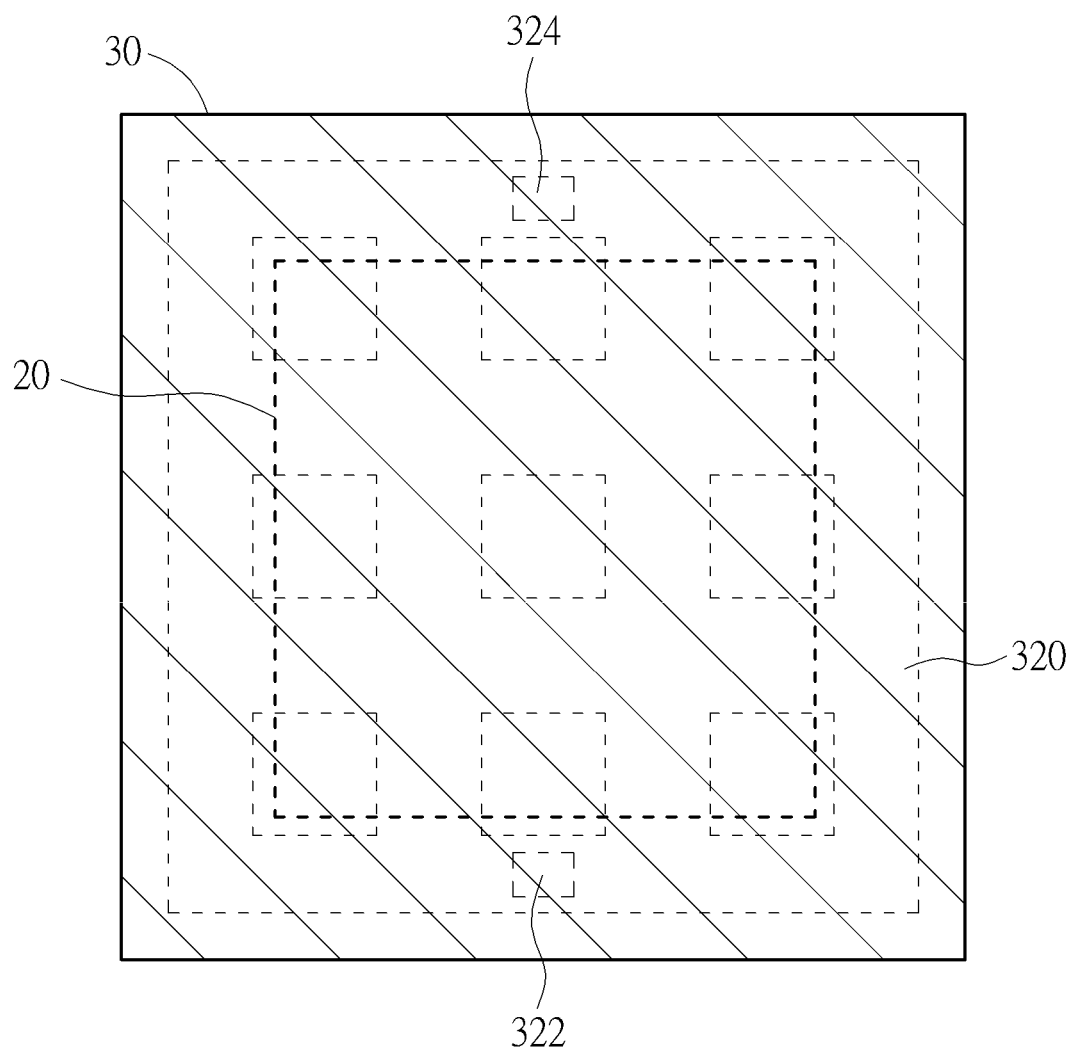

Some exemplary patterns for the liquid-cooling path or channel 320 are shown in FIG. 8 and FIG. 9. For example, in FIG. 8, the liquid-cooling path or channel 320 may be composed of a plurality of manifolds 321. For example, in FIG. 9, the liquid-cooling path or channel 320 may have a mesh-like pattern. In FIG. 8 and FIG. 9, some portions of the liquid-cooling path or channel 320 are located outside the projected area of the die 20 when viewed from the above.

Figure 10:
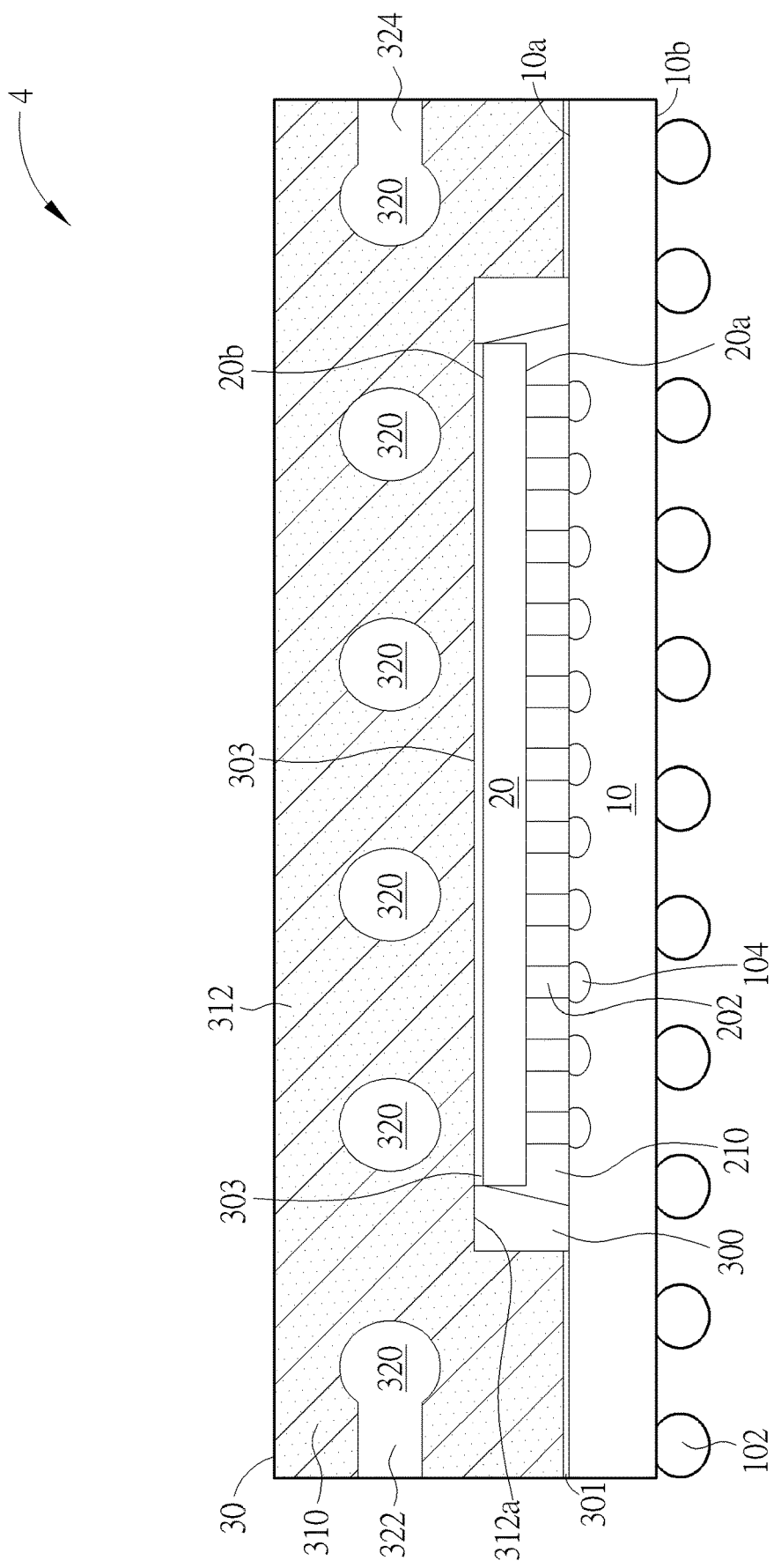
FIG. 10 is a schematic, cross-sectional diagram showing a lidded semiconductor package in accordance with still another embodiment of the invention.

FIG. 10 is a schematic, cross-sectional diagram showing a lidded semiconductor package in accordance with another embodiment of the invention. As shown in FIG. 10, the differences between the semiconductor package 4 in FIG. 10 and the semiconductor package 3 in FIG. 7 include that the liquid inlet 322 and the liquid outlet 324 of semiconductor package 4 in FIG. 10 are formed through the walls 310 to provide a thinner semiconductor package. It is to be understood that the lateral arrangement of the liquid inlet 322 and the liquid outlet 324 in FIG. 10 is for illustration purposes only. It is to be understood that the liquid inlet 322 and the liquid outlet 324 may be provide on the same wall 310 or on different walls 310 of the lid 30.

Figure 11:
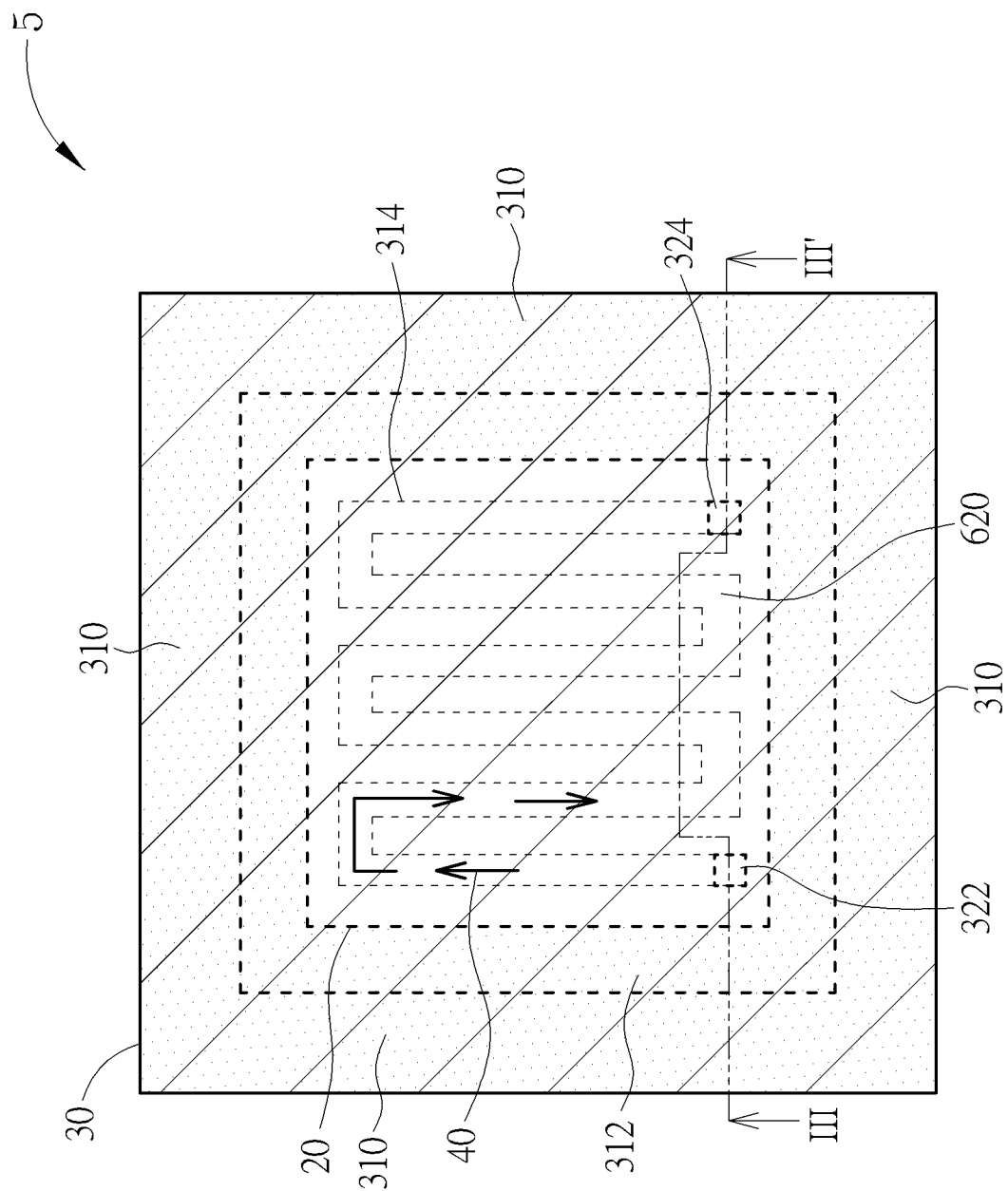
FIG. 11 is a perspective top view of a lidded semiconductor package in accordance with yet another embodiment of the invention.
Figure 12:
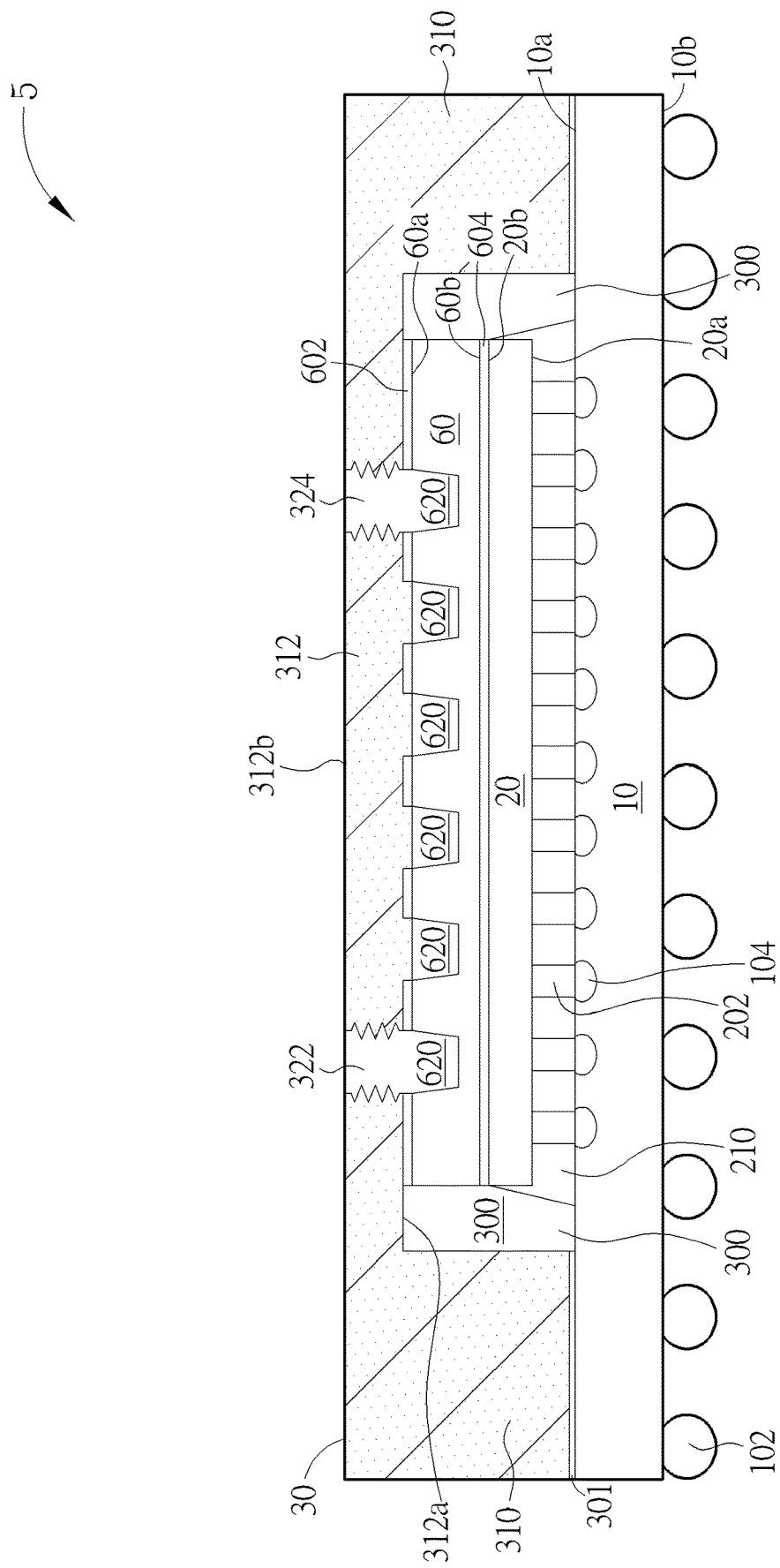
FIG. 12 is a cross-sectional view taken along line III-III' of FIG. 11.

Please refer to FIG. 11 and FIG. 12. FIG. 11 is a perspective top view of a lidded semiconductor package in accordance with yet another embodiment of the invention. FIG. 12 is a cross-sectional view taken along line of FIG. 11. Like layers, elements, or regions are designated by like numeral numbers or labels. As shown in FIG. 11 and FIG. 12, likewise, the semiconductor package 5 comprises a substrate 10 such as a packaging substrate or the like. The substrate 10 comprises a top surface 10*a* and a bottom surface 10*b*. For the sake of simplicity, the traces and interconnection in the substrate 10 are not shown in the figures. According to one embodiment, a plurality of solder balls 102 may be disposed on the bottom surface 10*b* of the substrate 10. According to one embodiment, a semiconductor chip or die 20 is mounted on the top surface 10*a* of the substrate 10 in a flip-chip fashion. The die 20 has an active surface 20*a* that faces downwardly to the substrate 10. A plurality of connecting elements 202 such as conductive bumps, micro bumps, pillars or the like may be provided on the active surface 20*a*. The connecting elements 202 are bonded to respective pads 104 disposed on the top surface 10*a* of the substrate 10. The die 20 may be underfilled with an encapsulant material 210 known in the art. The encapsulant material 210 surrounds the plurality of connecting elements 202.

According to one embodiment, a lid 30 is secured onto a perimeter of the top surface 10*a* of the substrate 10 with an adhesive layer 301. According to one embodiment, the lid 30 may comprise aluminum, copper or an alloy thereof, but is not limited thereto. A cavity 300 is created between the lid 30 and the substrate 10 and the die 20 is disposed within the cavity 300. According to one embodiment, the lid 30 may comprise four walls 310 and a cover plate 312 formed integrally with the four walls 310. The four walls 310 are spaced apart from the die 20.

According to one embodiment, as can be seen in FIG. 12, a dummy layer 60 such as a dummy die or a dummy metal layer is provided between the lid 30 and the die 20. The dummy layer 60 has an upper surface 60*a* that is adhered to the lower surface 312*a* of the cover plate 312 of the lid 30 with an adhesive layer 602. The dummy layer 60 has a lower surface 60*b* that is adhered to the rear surface 20*b* of the die 20 with an adhesive layer 604. According to one embodiment, the dummy layer 60 comprises a trenched feature 614 such as a serpentine half-etched trench recessed into the upper surface 60*a* of the dummy layer 60. According to one embodiment, for example, the lid 30 may have a thermal conductivity of about 300 W/(m·K) and the dummy layer 60 may have a thermal conductivity of at least about 180 W/(m·K).

As shown in FIG. 11 and FIG. 12, when the lid 30 is adhered onto the dummy layer 60 and the substrate 10, a liquid-cooling path or channel 620 for circulating a coolant 40 (shown in FIG. 11) relative to the semiconductor package 5 is formed between the cover plate 312 of the lid 30 and the dummy layer 60. According to one embodiment, the liquid-cooling path or channel 620 is located only directly above the die 20 when viewed from the above, as shown in FIG. 11. According to one embodiment, the coolant 40 in the liquid-cooling path or channel 620 is not in direct contact with the rear surface 20*b* of the die 20 during operation. According to one embodiment, likewise, a liquid inlet 322 and a liquid outlet 324 may be provided in an upper surface 312*b* of the cover plate 312 of the lid 30. According to one embodiment, as can be seen in FIG. 12, the liquid inlet 322 and the liquid outlet 324 may be through holes with threaded inner surface.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a substrate;
   a die mounted on a top surface of the substrate in a flip-chip fashion;
   a lid mounted on the die and on a perimeter of the substrate, wherein the lid comprises a cover plate and four walls formed integral with the cover plate, wherein the lid comprises half-etched trenches recessed into a lower surface of the cover plate; and
   a liquid-cooling channel situated between the cover plate of the lid and a rear surface of the die for circulating a coolant relative to the semiconductor package.

2. The semiconductor package according to claim 1, wherein the cover plate is directly secured to the rear surface of the die with an adhesive layer.

3. The semiconductor package according to claim 1, wherein the liquid-cooling channel is constructed by combining the trenched feature and the rear surface of the die.

4. The semiconductor package according to claim 1, wherein the coolant in the liquid-cooling channel is in direct contact with the rear surface of the die during operation.

5. The semiconductor package according to claim 1, wherein the liquid-cooling channel is buried within the cover plate of the lid.

6. The semiconductor package according to claim 5, wherein the coolant in the liquid-cooling channel is not in direct contact with the rear surface of the die during operation.

7. The semiconductor package according to claim 1, wherein a liquid inlet and a liquid outlet are provided in the lid, which communicate with the liquid-cooling channel.

8. The semiconductor package according to claim 7, wherein the liquid inlet and the liquid outlet are disposed in an upper surface of the cover plate.

9. The semiconductor package according to claim 7, wherein the liquid inlet and the liquid outlet are disposed in at least one of the four walls.

10. The semiconductor package according to claim 7, wherein the liquid inlet and the liquid outlet are through holes with threaded inner surface.

11. The semiconductor package according to claim 1, wherein the die is underfilled with an encapsulant material.

12. The semiconductor package according to claim 1, wherein a plurality of solder balls is disposed on a bottom surface of the substrate.

13. The semiconductor package according to claim 1, wherein the substrate comprises a packaging substrate.

14. The semiconductor package according to claim 1, wherein the lid comprises aluminum, copper or an alloy thereof.

* * * * *